US008223573B2

(12) United States Patent
Koeppe et al.

(10) Patent No.: US 8,223,573 B2
(45) Date of Patent: Jul. 17, 2012

(54) METHOD AND DEVICE FOR CONTROLLING A MEMORY ACCESS AND CORRESPONDINGLY CONFIGURED SEMICONDUCTOR MEMORY

(75) Inventors: Siegmar Koeppe, Munich (DE); Martin Ostermayr, Beacon, NY (US)

(73) Assignee: Infineon Technologies AG, Neubiberg (DE)

( * ) Notice: Subject to any disclaimer, the term of this patent is extended or adjusted under 35 U.S.C. 154(b) by 594 days.

(21) Appl. No.: 12/393,386

(22) Filed: Feb. 26, 2009

(65) Prior Publication Data

US 2009/0213674 A1 Aug. 27, 2009

(51) Int. Cl.
*G11C 7/14* (2006.01)

(52) U.S. Cl. ......... 365/210.13; 365/189.14; 365/189.15; 365/196; 365/208; 365/210.1

(58) Field of Classification Search ............. 365/189.14, 365/189.15, 194, 196, 208, 210.1, 210.13
See application file for complete search history.

(56) References Cited

U.S. PATENT DOCUMENTS

| | | | |
|---|---|---|---|
| 5,027,323 A | 6/1991 | Miyamoto et al. | |
| 5,689,471 A | 11/1997 | Voss et al. | |
| 5,850,366 A | 12/1998 | Coleman, Jr. | |
| 6,490,214 B2 * | 12/2002 | Kawasumi | 365/210.12 |
| 6,556,472 B2 * | 4/2003 | Yokozeki | 365/154 |
| 6,646,938 B2 * | 11/2003 | Kodama | 365/210.14 |
| 6,950,354 B1 * | 9/2005 | Akiyoshi | 365/200 |
| 6,982,914 B2 * | 1/2006 | Ohtsuki et al. | 365/210.1 |
| 7,394,682 B2 | 7/2008 | Ostermayr et al. | |
| 7,457,182 B2 * | 11/2008 | Maki et al. | 365/210.1 |
| 7,746,717 B1 * | 6/2010 | Peng et al. | 365/210.1 |
| 2002/0080670 A1 | 6/2002 | Kawasumi | |
| 2002/0186579 A1 * | 12/2002 | Yokozeki | 365/154 |
| 2003/0021144 A1 * | 1/2003 | Kodama | 365/154 |
| 2003/0231527 A1 | 12/2003 | Nakase et al. | |
| 2004/0141395 A1 * | 7/2004 | Ohtsuki et al. | 365/210 |
| 2006/0239094 A1 * | 10/2006 | Maki et al. | 365/210 |

* cited by examiner

*Primary Examiner* — Hoai V Ho
*Assistant Examiner* — Jay Radke
(74) *Attorney, Agent, or Firm* — Lee & Hayes, PLLC

(57) ABSTRACT

Method and device for controlling a memory access and correspondingly configured semiconductor memory A method and a device for controlling a memory access of a memory comprising memory cells are described. A completion of the memory access is determined by means of at least one dummy bit line. The at least one dummy bit line is connected to a plurality of memory cells of the memory cells of the memory such that a content of the at least one memory cell can be read out via the at least one dummy bit line. The at least one memory cell can be set to a predetermined potential. Each of said plurality of memory cells is connected to the at least one dummy bit line and to at least one dummy word line such that each of said plurality of memory cells can be set to the predetermined potential by means of the at least one dummy bit line and by means of the at least one dummy word line.

6 Claims, 7 Drawing Sheets

METHOD AND DEVICE FOR CONTROLLING A MEMORY ACCESS AND CORRESPONDINGLY CONFIGURED SEMICONDUCTOR MEMORY

The present invention relates to a method and a device for controlling both a reading and a writing memory access, and to a correspondingly configured semiconductor memory.

BACKGROUND OF THE INVENTION

In today's highly developed technologies, the production of semiconductor memories is greatly dependent on some particularly important design techniques. One of these particularly important design techniques is the realization of the so-called bit line dummy concept or pseudo bit line concept.

This concept comprises a single or a plurality of dummy bit lines or pseudo bit lines which are used as part of a (temporally) self-synchronizing block in a memory macro. In this case, the purpose of the dummy bit line as part of a synchronization circuit is to provide for the worst case with regard to capacitance, resistance and leakage current with respect to an active genuine bit line during a reading operation (READ operation) and writing operation (WRITE operation). In other words, the dummy bit line is intended to reflect the same properties and dependencies with respect to the production process of the corresponding semiconductor memory and the technology used therefore as the bit lines of the corresponding semiconductor memory.

With the aid of FIG. 1, the functioning of a bit line will now be explained with an example on the basis of an SPSRAM memory cell ("Single Port Static Random Access Memory" memory cell) comprising six transistors. The SPSRAM memory cell comprises two cross-coupled inverters (in this case, each inverter in the memory cell in FIG. 1 comprises an NMOS transistor (bottom) and a PMOS transistor (top), and two access transistors 2 (right and left)). In FIG. 1, the memory cell 1 is connected to the bit line 11 on the left and to the so-called bit line bar 12 on the right. While the bit line 11 has, during writing, the information to be written to the memory cell 1 and, during reading, the information read from the memory cell 1 or the corresponding potential (generally $V_{DD}$ for a logic 1 or a logic HIGH level, and $V_{SS}$ for a logic 0 or a logic LOW level), the bit line bar 12 (apart from the precharge phase described in detail later) has in each case the corresponding complement with respect to the potential or logic level of the bit line 11. In other words, if the bit line 11 has a logic LOW level (HIGH level) after the READ operation or a logic LOW level (HIGH level) during the WRITE operation, the bit line bar 12 has the logic HIGH level (LOW level) at the same time.

It should be noted that the bit line 11 is also called bit line true and the bit line bar 12 is also called bit line complement.

During a writing operation, therefore, the bit line 11 and/or the bit line bar 12 is charged to a potential corresponding to the information to be written to the memory cell 1. By activation of the word line 13, the potential of the bit line 11 or the corresponding logic level is then written to the memory cell 1. To put it more precisely, upon an activation of the word line 13 during a writing operation, the potential of a left-hand internal memory node 3 is set to the potential of the bit line 11. In the case of the memory cell 1 in FIG. 1, the potential of the left-hand internal memory node 3 reproduces the information of the memory cell itself, while a right-hand internal memory node 4 of the memory cell 1 in each case reproduces the complement of the information stored in the memory cell 1. It is possible equally well to activate the word line 14 and thus to set the potential of the right-hand internal memory node 4 to the potential of the bit line bar 12, in this case the inverted logic level (the complement of the logic level that would be written in via the bit line 11) being written to the right-hand internal memory node 4, such that the logic level then arises in the left-hand internal memory node 3 as a result of the construction of the memory cell. In other words, an item of information can be written to the memory cell 1 either via the bit line 11 by means of the left-hand word line 13 or by means of the bit line bar 12 by means of the word line 14.

It is generally preferred to work with a logic LOW level on the bit lines in order to write to the memory cell 1. This means that via the bit line bar 12 by means of the right-hand word line 14, a logic 0 is written to the right-hand internal memory node 4 if a logic 1 is to be written to the memory cell 1. By contrast, if a logic 0 is to be written to the memory cell 1, a logic LOW level is written to the left-hand internal node 3 and thus to the memory cell 1 via the bit line 11 with the aid of the word line 13. It is furthermore possible, during WRITE, to jointly activate the word lines 13, 14 and to apply mutually inverse data or levels to the two complementary bit lines 11, 12.

During a reading operation, the information stored in the memory cell 1 is read out onto the bit line 11 and/or onto the bit line bar 12. For this purpose, during the precharge phase, both the bit line 11 and the bit line bar 12 are precharged to a predetermined potential (generally in each case $V_{DD}$ (logic 1 or logic HIGH level)), the word line(s) 13 and/or 14 being deactivated. By virtue of the word line 13 and/or the word line 14 subsequently being activated, the bit line 11 assumes the potential or the logic level of the left-hand internal memory node 3 and/or the bit line bar 12 assumes the potential or the logic level of the right-hand internal memory node 4.

Since the bit line 11 is charged to a potential during the writing operation or precharged to a potential during the reading operation, for the internal sequence of a semiconductor memory comprising the memory cell 1, it is of crucial importance to determine the instant at which the potential of the internal node 3 of the memory cell 1 to be read can be determined by means of the bit line 11. It should be taken into account here that the bit line 11 and the bit line bar 12 are connected to e.g. 512 memory cells 1 in present-day semiconductor memories. Although, during a reading operation and also during a writing operation, in each case only one of said memory cells 1 is activated (written to or read) by means of the corresponding word line 13 or 14 (the word lines usually run perpendicular to the bit lines, that is to say unlike the illustration in FIG. 1), the memory content of the other non-activated memory cells nevertheless influences the behavior of the bit line 11 and the bit line bar 12.

The following proposals exist for solving this problem.

In a first proposal, the right-hand internal memory node 4 of one or more memory cells 1 connected to the dummy bit line is connected to ground ($V_{SS}$/GND). On account of the cross-coupling of the inverters of the memory cell 1, this forces the left-hand internal memory node 3 permanently to a logic HIGH level.

This proposal has the disadvantage, however, that design rules for protection against ESD ("Electrostatic Discharge") or latch-up are thereby contravened. In the case of the memory cell in FIG. 1, the PMOS transistor, top right, is connected to $V_{DD}$, on the one hand, and to $V_{SS}$, on the other hand, on account of the short-circuited internal memory node 4.

In a second proposal, the right-hand access transistors 2 of the memory cells 1 are not connected to the dummy bit line bar. It is assumed here that the potential at the internal memory node 3 becomes established at $V_{DD}$ or the logic HIGH level on account of the still connected dummy bit line 11, which represents a large capacitance. This proposal entails the risk, however, that an unknown number of memory cells which are connected to the dummy bit line 11 will assume a logic value different than 1, such that in this case the dummy bit line concept does not represent the worst case. As a matter of fact, in this second proposal it is totally unclear to what extent the respective individual construction of the dummy bit line with the connected memory cells represents the worst case, since the magnitude of the proportion of the memory cells which are connected to the dummy bit line and in which a logic 1 or a logic 0 has become established is unknown for the individual semiconductor memory. Furthermore, the proportion of the memory cells which assume the logic value 0 or 1 is crucially dependent on technological fluctuations, such that ultimately the temporal synchronization during the memory access is also dependent on the technological fluctuations. In other words, the semiconductor memory functions in one case, whereas it fails in the other case since the logic value 1 has not become established in too many of the memory cells.

SUMMARY

According to an embodiment of the invention, at least one dummy bit line is connected to a plurality of memory cells such that a content of said plurality of memory cells is readable via the at least one dummy bit line. Further, each of said plurality of memory cells is connected to the at least one dummy bit line and to at least one dummy word line such that each of said plurality of memory cells is settable to a predetermined potential by means of the at least one dummy bit line and by means of the at least one dummy word line. By means of the at least one dummy bit line, a completion of a memory access can be determined.

DETAILED DESCRIPTION

Figure 1:
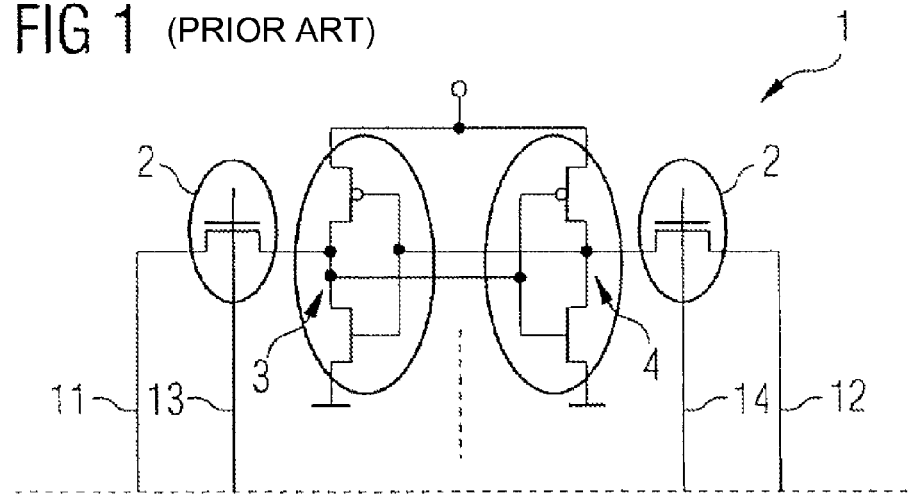
FIG. 1 illustrates a conventional SPSRAM memory cell comprising six transistors.

In the following, exemplary embodiments of the present invention will be described in detail. It is to be understood that the following description is given only for the purpose of illustrating the principles of the invention and is not to be taken in a limiting sense. Rather, the scope of the invention is defined only by the appended claims and is not intended to be limited by the exemplary embodiments described hereinafter.

A method for controlling a memory access of a memory comprising memory cells is provided in the context of an embodiment of the present invention. In this case, the memory access is understood to mean both a reading operation and a writing operation with regard to one or a plurality of memory cells of the memory. For controlling the memory access, more precisely for determining when a memory access has ended, use is made of the dummy bit line concept, this concept also being known as bit line dummy concept. For this purpose, each of a plurality of memory cells of the memory is connected to at least one dummy bit line, such that a memory content of said plurality of memory cells or dummy memory cells or pseudo memory cells can be read out via the at least one dummy bit line. Furthermore, the plurality of memory cells or these memory cells or the at least two memory cells are connected up in such a way that they can be set to a predetermined potential during the method according to the invention, that is to say can be set to the predetermined potential during the method according to the invention. To put it another way, the plurality of memory cells is connected up according to the invention in such a way that it is possible to alter a value respectively stored in the plurality of memory cells.

According to an embodiment, the individual dummy memory cell is substantially equivalent or substantially identical to a normal memory cell, i.e. does not differ from a normal memory cell with regard to its circuit topology or internal connectivity, and may typically have the same dimensioning. The dummy memory cell then has the same electrical behavior, in particular with regard to its leakage current, as a normal memory cell, such that the time behavior of a normal bit line can be accurately simulated or represented by means of the dummy bit line since the number of memory cells of the same type that are attached to the dummy bit line is (at least approximately) just the same as the number attached to the normal bit line. Thus the design or even layout of the dummy memory cells may be substantially equivalent or identical to that of the normal memory cells.

Thus, normal memory cells may be used for the dummy bit line concept. By using normal memory cells for the dummy bit line concept, the construction of which cells does not differ in any way from that of those memory cells which are connected to a normal bit line (instead of the dummy bit line), the behavior of the at least one dummy bit line also represents the behavior of a normal bit line, such that a simulation of the worst case also corresponds exactly to the worst case which can occur for a normal bit line.

Since, on the other hand, the construction of each of the plurality of memory cells which is connected to the at least one dummy bit line corresponds exactly to the construction of a normal memory cell which is used by the semiconductor memory for storing information, and since, moreover, the at least one dummy bit line is connected to each of the plurality of memory cells in just the same way as a normal bit line to normal memory cells, no additional design rules are contravened either.

By furthermore being able to set the memory cells which are connected to the at least one dummy bit line to any desired predetermined potential, it is possible to exactly simulate the worst case by choosing the number of memory cells which are connected to a dummy bit line to be equal to that number (or one less) which are connected to a normal bit line in the corresponding memory, and by simultaneously writing in each case a logic 1 or the corresponding potential to the memory cells connected to the dummy bit line.

Since technological fluctuations affect all the memory cells of a semiconductor memory equally, the dummy memory cells behave like the normal memory cells even in the case of a technological fluctuation, such that the temporal synchronization of memory accesses which is based on the dummy bit line concept according to the invention is independent of technological fluctuations, or a technological influence is unimportant.

Furthermore, the implementation of the method according to the invention is area-neutral, since the construction of the dummy memory cells costs precisely as much area as the construction of the same number of normal memory cells, since it is not necessary to make any modifications or supplementations whatsoever to the dummy memory cells.

In this case, each of the memory cells connected to the at least one dummy bit line can be connected to at least one dummy word line (at least one pseudo word line) in such a way that each of these memory cells can be set to any desired potential via the at least one dummy bit line and via the at least one dummy word line.

By way of example, nowadays typically 512 memory cells are connected to a dummy bit line and a dummy bit line bar, wherein a coupling of the same dummy bit line to each of these memory cells is performed via a same first dummy word line and a coupling of the same dummy bit line bar to each of these memory cells is performed via a same second dummy word line. Since all the memory cells in this case are connected to the same first dummy word line and the same second dummy word line, the memory content of all the memory cells can be set to a logic 1, for example, by means of only one writing operation.

In one embodiment, the at least one dummy bit line comprises a first and a second dummy bit line, and the at least one dummy word line comprises a first and a second dummy word line. In this case, a value of the first dummy bit line can be written to each of the plurality of memory cells with the aid of the first dummy word line, and, in a similar manner, a value of the second dummy bit line can be written to each of the plurality of memory cells with the aid of the second dummy word line. I.e. each memory cell of the plurality memory cells is connected to the first dummy word line, each memory cell of the plurality memory cells is connected to the second dummy word line, each memory cell of the plurality memory cells is connected to the first dummy bit line and each memory cell of the plurality memory cells is connected to the second dummy bit line.

If the second dummy word line is then held continuously at a predetermined potential of a first supply voltage (e.g. $V_{DD}$) and if the second dummy bit line is furthermore held continuously at a predetermined potential of a second supply voltage (e.g. $V_{SS}$), the value of the second dummy bit line is continuously written to each of the plurality of memory cells, such that each of the plurality of memory cells continuously has the corresponding logic value (e.g. 1). In this embodiment, the first dummy word line is continuously maintained at the predetermined potential of the second supply voltage, such that each connection between each of the plurality of memory cells and the first dummy bit line which can be switched with the aid of the first dummy word line is substantially inhibited by the first dummy word line. In this embodiment, the completion of the memory access is then determined with the aid of the first dummy bit line.

Since the first dummy word line, the second dummy word line and the second dummy bit line are continuously or constantly held at a corresponding potential, the interconnection of these three lines is advantageously very simple and hence space-saving and does not require complicated driving in order to supply the corresponding line (first or second dummy word line or second dummy bit line), with varying potentials.

In this embodiment, therefore, the value of the second dummy bit line is continuously written to each of the plurality of memory cells by the second dummy word line continuously having a potential such that the value of the second dummy bit line is continuously written to each of the plurality of memory cells. Furthermore, the first dummy word line continuously has a potential such that each switchable connection between the first dummy bit line and each of the plurality of memory cells is continuously (substantially) inhibited. The potential which the first and second dummy word lines and the second dummy bit line then actually have or the supply voltage to which they are connected is then dependent on the following conditions:

On the reading concept of the semiconductor memory (will be explained in greater detail later). Dependent on this reading concept is the potential (e.g. $V_{SS}$ or $V_{DD}$) to which the second dummy bit line is precharged, and dependent on this in turn is the logic value which is written to each of the plurality of dummy memory cells.

On the internal construction of the memory cell. If the value of the second dummy bit line is written directly (in non-inverted fashion) to the individual memory cell and thus corresponds to the value which the first dummy bit line "sees" (which could be read out onto the first dummy bit line) or if the value of the second dummy bit line is written in inverted fashion to the individual memory cell.

On the construction of the switchable connections (e.g. the access transistors) between the first or second dummy bit line and each of the plurality of memory cells. Depending on that, the corresponding switchable connections are inhibited by the first or second dummy word line having the potential of the first (second) supply voltage, or are activated by the first or second dummy word line having the potential of the second (first) supply voltage.

The expression "substantially inhibited" used above means that each switchable connection between each of the plurality of memory cells and the first dummy bit line which is controlled by means of the first dummy word line is more or less inhibited, such that a leakage current which flows when determining the completion of the memory access from the plurality of memory cells to the first dummy bit line is controlled by means of the potential provided on the first dummy word line. As has already been explained beforehand, precisely this leakage current disturbs the evaluation of a memory access via a bit line in the genuine memory, if e.g. a memory cell at the logic LOW level is read and this read memory cell thus pulls the bit line to $V_{SS}$ against the leakage current of its sister memory cells which are connected to the same bit line. Depending on the potential in this case of those word lines of these sister memory cells which are not being read, the connections between these sister memory cells and the bit line is more or less inhibited. Precisely this behavior of these word lines in interaction with the sister memory cells and the bit line is then simulated by means of the potential which the first dummy word line is continuously at in this exemplary embodiment, by means of the first dummy word line, the plurality of memory cells and the first dummy bit line. In other words, this embodiment also encompasses the case where the first or second dummy word line or the second dummy bit line constantly has a potential which does not correspond to that of one of the main supply voltages (e.g. $V_{SS}$ or $V_{DD}$), but rather, particularly in the case of the first dummy word line, deviates slightly from a potential of said main supply voltages.

If the second dummy word line is continuously held at such a potential such that the value of the second dummy bit line is continuously written to each of the plurality of memory cells via switchable connections (e.g. via respective transistors between the second dummy bit line and the memory cells), this can have an adverse long-term effect on said switchable connections (the respective transistors). Therefore, it is proposed, in an embodiment developed further, for the second dummy word line not to be continuously held at the predetermined potential, but rather for this potential to be applied to the second dummy word line only at least once in order thereby to program the value of the second dummy bit line into each of the plurality of memory cells.

The switchable connections between the second dummy bit line and each of the plurality of memory cells are thereby loaded to a significantly lesser extent, with the result that its durability is improved by comparison with the previous embodiment. Since the dummy memory cells, as already expressed in the term, are cells which store a value respectively written to them, it suffices to store the corresponding value (e.g. the logic 1) only once in each of the plurality of memory cells, this value then remaining stored in the respective memory cell during operation until it is altered again externally by means of the dummy bit lines and dummy word lines.

In another embodiment according to the invention, the value of the second dummy bit line is written to each of the plurality of memory cells in such a way that the first and the second dummy word line are switched at least once to the same predetermined potential (e.g. $V_{DD}$), e.g. since the first and the second dummy word line are connected to one another. In this embodiment, too, the second dummy bit line is continuously held at a further predetermined potential (e.g. $V_{SS}$). In order then to determine the completion of the memory access by means of the first dummy bit line, for this purpose both the first and the second dummy word line are set to a potential, such that the switchable connections between each of plurality of memory cells and the first dummy bit line remains substantially inhibited.

This embodiment affords the following advantages. Firstly, in memory cells operating with two word lines, these two word lines are generally driven in each case with the same potential, such that the driving in this embodiment corresponds to the behavior for normal memory cells. Furthermore, secondly there are memory cells wherein a continuous connection between a connection for the first word line and a connection for the second word line already exists within the individual memory cell, such that after a connection of the first and the second word line (or the first or second dummy word line), the two word lines (or dummy word lines) are electrically connected to one another, such that the first and the second dummy word line can only have the same potential or can be driven in identical fashion. With regard to these two cases, therefore, it is advantageous if the two dummy word lines in the embodiment outlined above are in each case driven in identical fashion (that is to say with the same potential) in order to carry out the driving of each of the plurality of memory cells connected to the dummy bit lines and dummy word lines as far as possible in just the same way as when driving those memory cells of the memory in which the completion of the memory access is to be determined with the aid of the dummy bit lines.

It is also possible for the switchable connections between each of the plurality of memory cells and the at least one dummy bit line to be substantially inhibited if the completion of the memory access is determined by means of the at least one dummy bit line. For this inhibiting, the at least one dummy word line is set to a predetermined potential. In this case, this predetermined potential can be adjusted in such a way that a leakage current between the plurality of memory cells and the at least one dummy bit line is thereby adjusted to a predetermined value for the leakage current.

As has already been explained above, by adjusting the leakage current between the plurality of memory cells and the at least one dummy bit line, that leakage current is simulated which occurs between those memory cells in which the completion of the memory access is to be determined and the bit line or the bit lines connected to these memory cells. Since this leakage current can change over the life cycle of a semiconductor memory, e.g. on account of aging and stress phenomena, it is advantageous also to be able to correspondingly adjust the simulated leakage current between the plurality of memory cells and the at least one dummy bit line. This is advantageously possible by means of the corresponding adjustment of the predetermined potential of the at least one dummy word line.

Since, with the aid of the at least one dummy bit line, any desired potential can be written to the respective cell of the plurality of memory cells, it is also possible according to the invention to write to each of the plurality of memory cells a potential which lies between a first supply voltage (e.g. $V_{DD}$) and a second supply voltage (e.g. $V_{SS}$). This potential corresponds, in particular, to an average value of the first supply voltage (e.g. $V_{DD}$) and the second supply voltage (e.g. $V_{SS}$). Characterizing data (that is to say characterizing properties (e.g. leakage current)) of the corresponding memory cell can be determined by means of the adjustment of such an intermediate potential.

A metastable state (that is to say a potential which lies between the first supply voltage and the second supply voltage) can thus advantageously be adjusted in the respective of the plurality of memory cells. Such a metastable state can only be compulsorily maintained by at least one dummy word line remaining active.

Furthermore, it is possible to set each of the plurality of memory cells to the predetermined potential in this way by setting one of the at least one dummy word line to a potential which is higher than the second supply voltage (that is to say higher than e.g. $V_{DD}$ in the case of NMOS access transistors).

By raising above $V_{DD}$ the potential of that dummy word line by means of which the potential is written to the memory cell, it is advantageously also possible to write a logic HIGH level directly to the memory cell. This is because, on account of the threshold voltage(s) of the access transistor(s), it is preferred to write only a logic LOW level directly to the respective memory cell, a logic HIGH level being written to the memory cell by a logic LOW level being written via the complementary (dummy) bit line which is connected by means of the corresponding access transistor to that internal node of the memory cell which has an inverted value with respect to the value stored in the memory cell, as will be explained in greater detail later with the aid of the figures. By now raising the potential of the corresponding dummy word line beyond $V_{DD}$, in particular to a value of at least ($V_{DD}$+ $V_{th}$), the disturbing threshold voltage ($V_{th}$) is virtually compensated for, such that a logic HIGH level can also be written by means of the dummy word line onto the internal node of the memory cell which is connected via the access transistor to the corresponding dummy bit line which is activated via the dummy word line. This procedure is also known as the "boosting concept" in normal memory cells. Directly writing in a logic LOW level and a logic HIGH level is advantageous, of course, in memory cells in which exclusively direct writing in can be effected, that is to say either which can only be written to by means of a (dummy) bit line or in which no inversion of the value written in takes place internally.

In one preferred exemplary embodiment, the same predetermined potential is written to each memory cell which is connected to the at least one dummy bit line.

During a reading operation in which both the normal bit line and the normal bit line bar are precharged with $V_{DD}$, the worst case is if all the memory cells connected to the bit line and the bit line bar apart from the memory cell to be read have a logic 1 as memory content. In this case, the leakage currents from the non-read (non-activated) memory cells ensure that the potential of the bit line is pulled to $V_{DD}$, such that the read (activated) memory cell not only has to lower the precharged potential of the bit line from $V_{DD}$ in the direction of $V_{SS}$, but additionally has to fight against the leakage currents of the other memory cells. Therefore, for simulating the worst case, a logic 1 is respectively written to all the memory cells connected to the dummy bit line.

It is also possible, however, to divide the memory cells connected to the at least one dummy bit line into two sets, a first and a second set, wherein the memory cells of the first set are set to a logic 0 and the memory cells of the second set are set to a logic 1.

Investigations have shown that the above-described worst case where all the memory cells apart from the read memory cell contain a logic 1 virtually does not occur in reality. In other words, if the timing control of a memory is designed in such a way that it is oriented to said worst case, it therefore operates more slowly than would be necessary in reality. Therefore, it is expedient to set at least a small proportion of the memory cells connected to the at least one dummy bit line to a logic 0, whereby the leakage currents of the corresponding memory cells no longer pull the potential of the dummy bit line to $V_{DD}$ if a reading operation is simulated by means of the dummy bit line. As a result, the timing control is better adapted to worst cases that occur in reality.

On the other hand, it should be pointed out that present-day semiconductor memories generally operate with error detecting or even error improving codes, such that in an exceptional case if a singular reading error actually occurs for an individual bit, this reading error e.g. within a memory word of in total 64 bits can be either detected or even eliminated (corrected).

If the memory cells connected to the at least one dummy bit line are divided into two sets, it can be expedient to connect the memory cells of the first set to the same first dummy word line and the memory cells of the second set to the same second dummy word line. The memory cells of the first set can thereby be set to a predetermined potential independently of the memory cells of the second set, such that it is possible, for example, to set the memory cells of the first set to the logic value 1 and the memory cells of the second set to the logic value 0.

It is equally well possible to connect the memory cells of the first set to the same first dummy bit line bar and the memory cells of the second set to the same second dummy bit line bar, such that the memory cells of the first set are not connected to the second dummy bit line bar and the memory cells of the second set are not connected to the first dummy bit line bar. As a result, the memory cells of the first set can be set to one predetermined potential via the first dummy bit line bar, and at the same time the memory cells of the second set can be set to another predetermined potential via the second dummy bit line bar.

In one embodiment according to the invention, only precisely one dummy bit line exists. In this case, the completion of the memory access or the point in time at which the normal bit lines can be evaluated during a reading operation (by means of a sense amplifier), or the point in time at which a writing operation for memory cells connected to normal bit lines is deemed to be concluded, is determined by means of this one dummy bit line. This is because the completion of the memory access is present when the potential of the dummy bit line assumes a predetermined potential or lies above or below a predetermined potential threshold.

For determining the completion of the memory access, in this case the dummy bit line can be precharged to a first potential or initial potential in a first step and can subsequently be pulled to a second potential or target potential, which is different from the first potential, in a second step (e.g. via at least one transistor). The predetermined potential upon attainment of which the completion of the memory access is detected accordingly lies between the first and the second potential. Consequently, the point in time at which the dummy bit line attains the predetermined potential is determined in practice in this way by checking when the potential of the dummy bit line lies above the predetermined potential, if the first potential lies below the second potential, or when the potential of the dummy bit line lies below the predetermined potential, if the first potential lies above the second potential. In this case, the predetermined potential whose attainment determines the point in time of the completion of the memory access lies in particular around a value of 25% to 50% of the magnitude of the difference between the first potential and the second potential below the first potential, if the first potential lies above the second potential, or above the first potential, if the first potential lies below the second potential.

In another embodiment according to the invention, a first and a second dummy bit line exist. In this embodiment, each memory cell which is connected to the first dummy bit line is also connected to the second dummy bit line (i.e. each memory cell of the plurality of memory cells is connected to the first dummy bit line and each memory cell of the plurality of memory cells is connected to the second dummy bit line. The completion of the memory access is detected if a difference between a potential of the first dummy bit line and a potential of the second dummy bit line is greater than a predetermined threshold value.

If the normal memory cells are in each case connected to a bit line and a bit line bar, during a reading operation the value read out from a memory cell is determined by means of the potential difference between the potential of the bit line and the potential of the bit line bar. In order to determine the point in time at which this potential difference between the bit line and the bit line bar is to be evaluated in order to determine the point in time of the completion of the reading operation or memory access, this differential reading is simulated with the first and the second dummy bit line (dummy bit line and dummy bit line bar). In this case, the point in time of the completion of the memory access has arrived when the potential of the first dummy bit line has become sufficiently far removed from the potential of the second dummy bit line or when the potential of the second dummy bit line has become sufficiently far removed from the potential of the first dummy bit line, assuming that the two dummy bit lines were precharged to the same potential at the beginning of the reading operation (memory access).

For determining the point in time of the completion of the memory access by means of the first and the second dummy bit line, the two dummy bit lines are precharged to the same predetermined first potential or initial potential in a first step. Afterward, in a second step, the first dummy bit line is pulled to a second potential or target potential via at least one transistor. The completion of the memory access is present when a magnitude of a difference between the potential of the first dummy bit line and the potential of the second dummy bit line has reached a predetermined magnitude or has exceeded the predetermined magnitude. The predetermined magnitude is typically defined in a range of 25% to 50% of the magnitude of the potential difference between the first and the second potential.

A device for controlling a memory access of a memory comprising memory cells is also described according to an embodiment of the present invention. In this case, the device has at least one dummy bit line and a detection device, which determines the point in time of the completion of the memory access with the aid of the at least one dummy bit line. In this case, the device is configured in such a way that the at least one dummy bit line is connected to a plurality of the memory cells of the memory in such a way that a content of these memory cells connected to the at least one dummy bit line can be read out via the at least one dummy bit line. Furthermore, each of the plurality of memory cells which is connected to the at least one dummy bit line can be set to a predetermined potential, that is to say to a predetermined logic level, via the device. Even if each of the plurality of memory cells which is connected to the at least one dummy bit line is constructed in such a way that it can be set to a predetermined potential (that is to say that it is possible to alter the potential of the at least one memory cell), the scope of the present invention is also intended to encompass the case where each of the plurality of memory cells is driven by the device in such a way that the same value is continuously written to each of the plurality of memory cells.

The advantages of the device according to this embodiment substantially correspond to the advantages of the method according to the invention which have been discussed comprehensively above, such that a repetition is dispensed with here.

In accordance with one embodiment according to the invention, the device can additionally comprise a driving unit and at least one dummy word line. In this case, each memory cell which is connected to the at least one dummy bit line is also connected to the at least one dummy word line. The driving unit is able, then, to drive the at least one dummy word line and in certain embodiments also the at least one dummy bit line in such a way that each memory cell which is connected to the at least one dummy bit line is set to a predetermined potential. In this case, the predetermined potential of one of these memory cells can indeed have a different potential than the potential of another of these memory cells which are connected to the dummy bit line.

Although the driving unit is present in order to adjust the at least one dummy word line and the at least one dummy bit line to a specific potential, the present invention also encompasses, of course, those variants in which the potential of the at least one dummy word line and/or the potential of the at least one dummy bit line is adjusted via a further facility or via the device itself or is provided in some other way. Also mixed forms are possible in which the potential of one of the at least one dummy word line or of the at least one dummy bit line is adjusted or provided via the driving unit or device and in which the potential of another of the at least one dummy word line or of the at least one dummy bit line is then adjusted or provided in some other way.

In one embodiment according to the invention, the number of those memory cells which are connected to the at least one dummy bit line corresponds to the number of memory cells of the memory which are connected to a same bit line of this memory, or corresponds to one less than this number.

In one embodiment according to the invention, the device comprises three dummy bit lines and two dummy word lines. In this embodiment, the plurality of memory cells is divided into a first set of these memory cells and into a second set of these memory cells. In this case, each of the plurality of memory cells is connected to the first dummy bit line, a first set of the plurality of memory cells is connected to the second dummy bit line and a second set of the plurality of memory cells is connected to the third dummy bit line. Furthermore, each of the plurality of memory cells is connected both to the first and to the second dummy word line. The driving unit is then configured in such a way that the driving unit, via the second dummy word line, writes the potential of the second dummy bit line to the first set of memory cells and the potential of the third dummy bit line to the second set of memory cells.

As a result, it is advantageously possible to write for example a logic 0 to the first set of memory cells and a logic 1 to the second set of memory cells, in order thereby to match a loading to which the first dummy bit line is subjected to a loading to which a bit line connected to the plurality of memory cells for which the completion of the memory access is to be determined is maximally subjected in practice. This subject has been explained in detail above.

According to an embodiment of the present invention, a semiconductor memory comprising a device according to an embodiment of the invention is also provided, such that this semiconductor memory according to the embodiment controls its memory access by means of the bit line dummy concept presented here.

In one embodiment according to the invention, the semiconductor is able to process at least one of the following control signals:
  Write-Enable
    A write access to the semiconductor memory is prepared by means of this command or by means of this signal.
  Read-Enable
    A read access to the semiconductor memory is prepared by means of this command or by means of this signal.
  Block-Select
    One of different blocks within the semiconductor memory is selected by means of this command or by means of this signal.

In this embodiment, the device according to the embodiment is configured in such a way that it writes to each of the plurality of memory cells the predetermined potential in each case at least in the event of one of said control signals (that is to say at least whenever this one control signal occurs). In principle, all signals which signal an access to the semiconductor memory can be utilized as control signals alongside a global signal, such as e.g. RESET.

The presented embodiments can be used in memories which operate with at least one bit line being precharged during memory access. The invention can thus be used in particular in RAMs which use as memory cells SPSRAM memory cells (comprising six transistors), DPSRAM memory cells ("Dual Port Static Random Access Memory" memory cell) (comprising eight transistors), 8T-SPSRAM memory cells having a separate pull-down read line or 3T or 4T memory cells. It is to be understood that the present invention is not restricted to this area of application, but rather can be used for any memory in which data are written or else only read with the aid of a bit line, such that the present invention can also be used in a ROM (e.g. in a dynamic ROM).

The DPSRAM memory cells, e.g. 8T-DPSRAM memory cells, have two additional access transistors, so that it is possible to twice connect in each case a bit line and a bit line bar (a total of four bit lines) to a DPSRAM memory cell, four word lines (one for each access transistor) then being used. As a result, in the case of the DPSRAM memory cells which are connected via the same bit lines, two read accesses or two write accesses or one read and one write access (this last of course not for an individual DPSRAM memory cell) can be effected simultaneously. If the two additional access transistors of the DPSRAM memory cell are inhibited by means of corresponding dummy word lines, the DPSRAM memory cell behaves like an SPSRAM memory cell, such that the considerations and embodiments described above also apply to the DPSRAM memory cells. The same applies to memory cells having even further access transistors.

However, the present invention can, of course, also be used in further types of memory cells, such as e.g. an 8T-SPSRAM memory cell having a separate pull-down read bit line, a 4T memory cell and a 3T memory cell, as will be discussed later.

The present invention is explained in more detail below with reference to the drawings.

FIG. 1 illustrates a conventional SPSRAM memory cell 1, which has already been described above. Such a memory cell 1 can be used, on the one hand, as a normal memory cell for storing one bit. On the other hand, such a memory cell 1 can also be used according to an embodiment of the invention with a dummy bit line 11 and a dummy bit line bar 12 as a dummy memory cell 1 in order thereby to form the so-called bit line dummy concept wherein the time behavior of a normal bit line and of a normal bit line bar in the worst case is simulated by means of the dummy bit line and the dummy bit line bar together with a plurality of the dummy memory cells 1 illustrated in FIG. 1. On account of its construction, the memory cell in FIG. 1 can be operated in "dual rail" fashion (in complementary fashion) both during writing and during reading.

Figure 2:
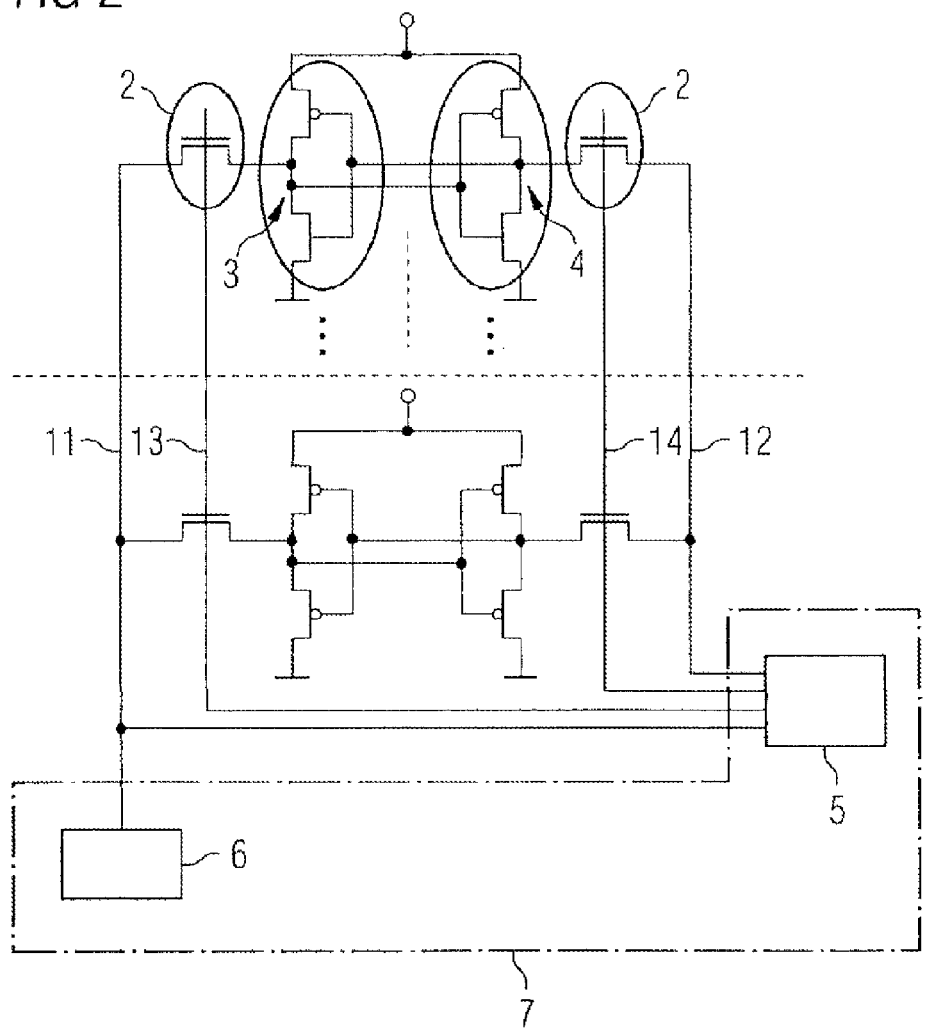
FIG. 2 illustrates two dummy memory cells together with a driving unit according to the invention.

FIG. 2 illustrates two of a plurality of dummy memory cells 1 which are in each case connected to the dummy bit line 11, the dummy bit line bar 12, a first dummy word line 13 and a second dummy word line 14. In this case, the dummy bit line 11, the dummy bit line bar 12, the first dummy word line 13 and the second dummy word line 14 are driven by a driving unit 5 of a device 7 of a semiconductor memory 10 illustrated in FIG. 3.

In the following a difference in the external connections of dummy memory cells for controlling a memory access of a memory according to embodiments of the invention with respect to normal memory cells for storing information will be described. In the case of normal memory cells for storing information both of the access transistors 2 of the memory cell above (in FIG. 2) are connected externally (outside the memory cell) with a first word line and both of the access transistors 2 of the memory cell below are connected externally to a second word line which is different from the first word line. In other words bit lines are arranged vertical to bit lines for a normal arrangement of memory cells for storing information while the at least one bit line and the at least one word line are running in parallel for preferred embodiments of the invention.

That is to say, a connection (e.g. via a metal conductor) between access transistors (e.g. the access transistors 2) is regarded as an external connection. This means, if for two memory cells the only difference is such an external connection between the access transistors (e.g. one memory cell has such a connection and the other has not), these memory cells are deemed to be identical according to the present disclosure. Further, the two memory cells are regarded as being substantially equivalent or substantially identical if they merely differ in dimensioning or layout details.

Figure 3:
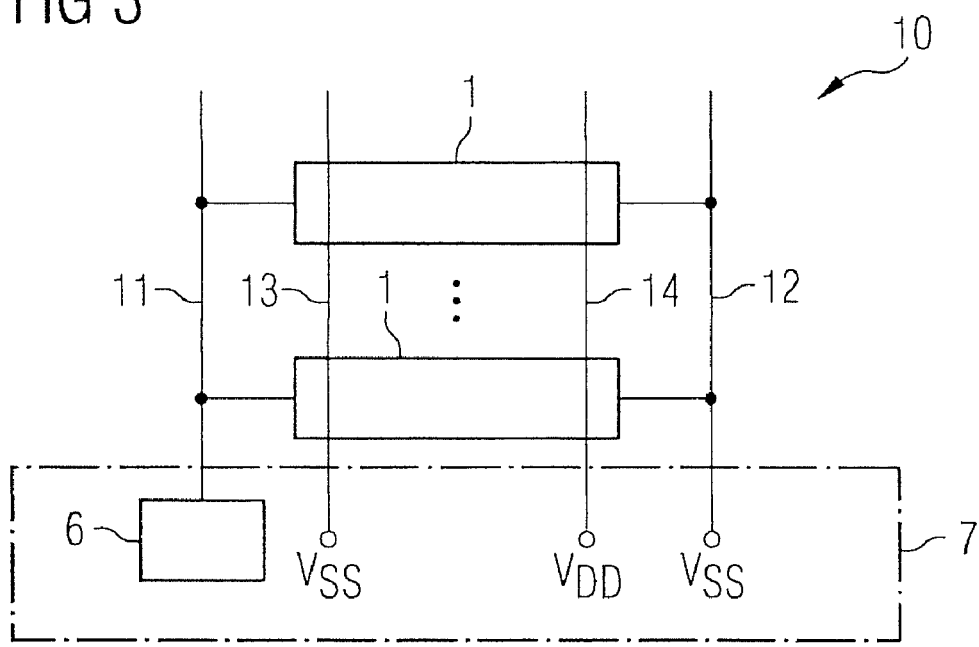
FIG. 3 illustrates a first embodiment according to the invention for a device for controlling a memory access, in which two dummy word lines and one dummy bit line are continuously at a predetermined potential.

The device 7 according to an embodiment of the invention as illustrated in FIG. 3 does not comprise a functional driving unit 5 since the first dummy word line 13 is continuously held at a LOW level ($V_{SS}$) and the second dummy word line 14 is constantly held at a HIGH level ($V_{DD}$). Furthermore, the second dummy bit line 12 is constantly at $V_{SS}$. As a result of this constant configuration of the second dummy bit line 12 and of the second dummy word line 14, a logic HIGH level is continuously written to the memory cells 1.

It should be noted that the dummy word lines 13, 14 are usually not connected directly to a supply voltage ($V_{DD}$ or $V_{SS}$), rather the potential of the corresponding supply voltage is virtually mirrored onto the corresponding dummy word line 13, 14 or, to put it another way, the potential of the corresponding dummy word line 13, 14 is a replica of the corresponding supply voltage. This electrical insulation of the dummy word lines from the corresponding supply voltage advantageously avoids ESD failures. The corresponding potentials or levels of the dummy word lines 13, 14 can be generated, for example, by tie cells (see e.g. patent specifications U.S. Pat. No. 7,221,183 or U.S. Pat. No. 6,396,306).

This generation of the potential of a dummy word line by means of a replica of the corresponding supply voltage can be used, of course, in all the embodiments illustrated and discussed here. For this purpose, on all the dummy word lines in the figures in which $V_{DD}$ or $V_{SS}$ is depicted, it is necessary to realize a corresponding tie cell, for example, which then adjusts the potential of the corresponding dummy word line.

During a reading operation of the semiconductor memory 10 the dummy bit line 11 is then precharged to the logic HIGH level ($V_{DD}$) in a first step. In a further step, the dummy bit line 11 is pulled via one or a plurality of transistors in a detection device 6 to a logic LOW level ($V_{SS}$) complementary to the logic HIGH level. In this case, this one or this plurality of transistors correspond with regard to their driver capability to a normal memory cell which, during a reading operation, pulls a bit line to the logic LOW level ($V_{SS}$) (if a logic 0 is stored in the memory cell), in order thereby to simulate the driver capability of this normal memory cell in the detection device 6 as well as possible. In this case, the detection device 6 measures the potential on the dummy bit line 11. If this potential is less than a predetermined threshold value, the sense amplifiers (not illustrated) of the semiconductor memory 10 are activated in order to evaluate the normal bit lines (and possibly bit lines bar, connected to them, whereby the actual reading operation is concluded. The predetermined threshold value used in this case is constant and is chosen, depending on the configuration of the semiconductor memory 10, in the case of time-critical semiconductor memories in a range of 50% to 80% of $V_{DD}$ ($0.5*V_{DD}$ to $0.8*V_{DD}$)—better 60% to 70% of $V_{DD}$ ($0.6*V_{DD}$ to $0.7*V_{DD}$)—or in the case of time-noncritical semiconductor memories or in the case of semiconductor memories having high safety requirements in a range of 20% to 50% of $V_{DD}$ ($0.2*V_{DD}$ to $0.5*V_{DD}$)—better 30% to 40% of $V_{DD}$ ($0.3*V_{DD}$ to $0.4*V_{DD}$).

The choice of this predetermined threshold value is in this case a balance between a minimum swing (that is to say a smallest possible but sufficiently large difference between a potential representing the logic value 0 and a potential representing the logic value 1) and the maximum achievable interference immunity. The greater the swing, the greater, too, is the interference immunity, but the longer the memory access lasts, too. This balancing also applies to a differential detection of the completion of a reading operation, wherein the completion is detected by means of the dummy bit line 11 and the dummy bit line bar 12.

Figure 4A:
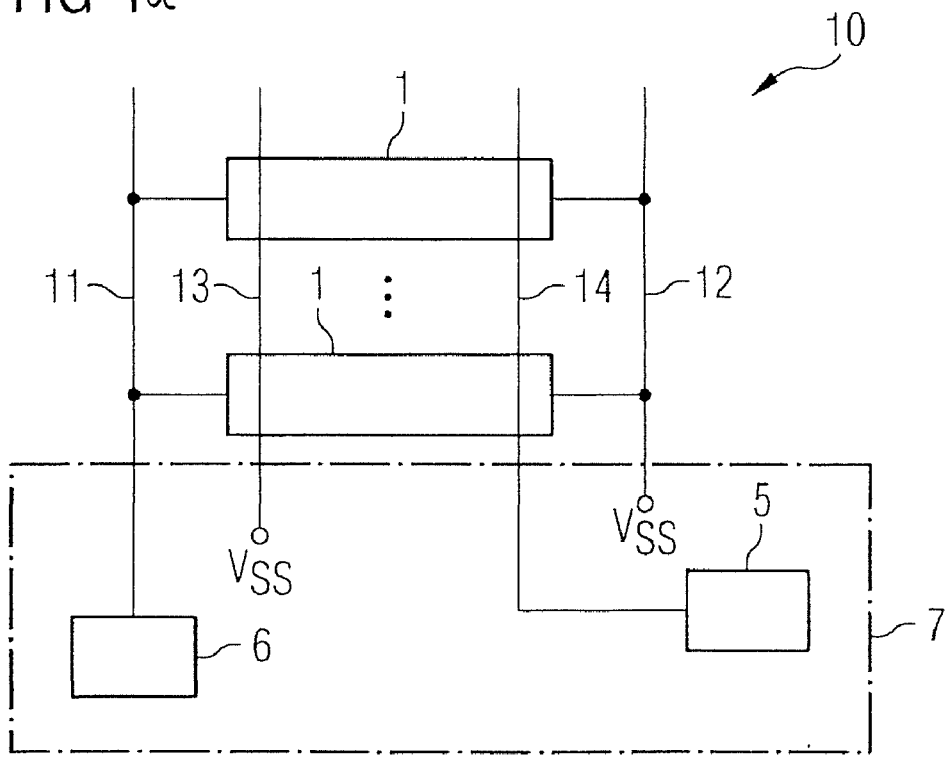
FIG. 4a illustrates a further embodiment according to the invention of a device for controlling a memory access, in which a dummy word line is triggered via a driving unit.

In a further embodiment of the device 7 or of the semiconductor memory 10 as illustrated in FIG. 4a, the second dummy word line 14 is not constantly at a predetermined potential, but rather is "triggered" by a driving unit 5. As a result the access transistors 2 are not continuously activated, which is advantageous with regard to their durability. The driving unit 5 is configured in this case in such a way that it ensures that the potential ($V_{SS}$), of the dummy bit line bar 12 is written to the second internal node 4 of each memory cell 1 and a logic HIGH level is thus written to each memory cell 1. By way of example, the driving unit 5 could be configured in such a way that this occurs during each memory access which is identified for example by Write-Enable, Read-Enable, or Block-Select.

With regard to the further construction and with regard to the further operation, the device 7 and thus the semiconductor memory 10 correspond to the embodiment illustrated in FIG. 3.

The expression "triggering" is understood to mean here that the driving unit 5 generates a pulse on the second dummy word line 14, by means of which the value of the dummy bit line bar 12 is written to the memory cells 1. At times at which the pulse is not generated or is not triggered, the driving unit holds the second dummy word line at a value such that the access transistors 2 (on the right in FIG. 2) controlled thereby are inhibited.

Figure 4B:
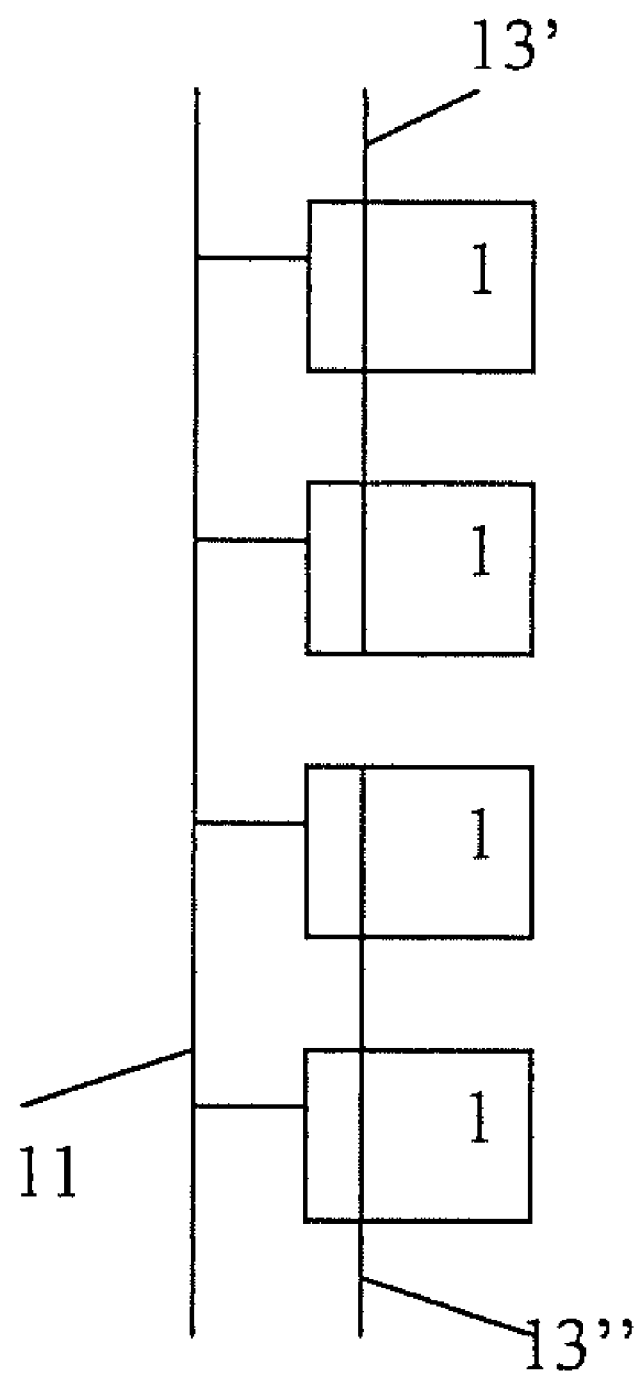
FIG. 4b illustrates another embodiment according to the invention, in which a first set of memory cells is connected to a different dummy word line than a second set of memory cells.

FIG. 4b illustrates a further embodiment of the invention. In this embodiment a first set or plurality of memory cells 1 is connected to a first dummy word line 13' and a second set or plurality of memory cells is connected to a second dummy word line 13". Each of the first plurality of memory cells and each of the second plurality of memory cells is connected to the same dummy bit line 11.

Figure 5:
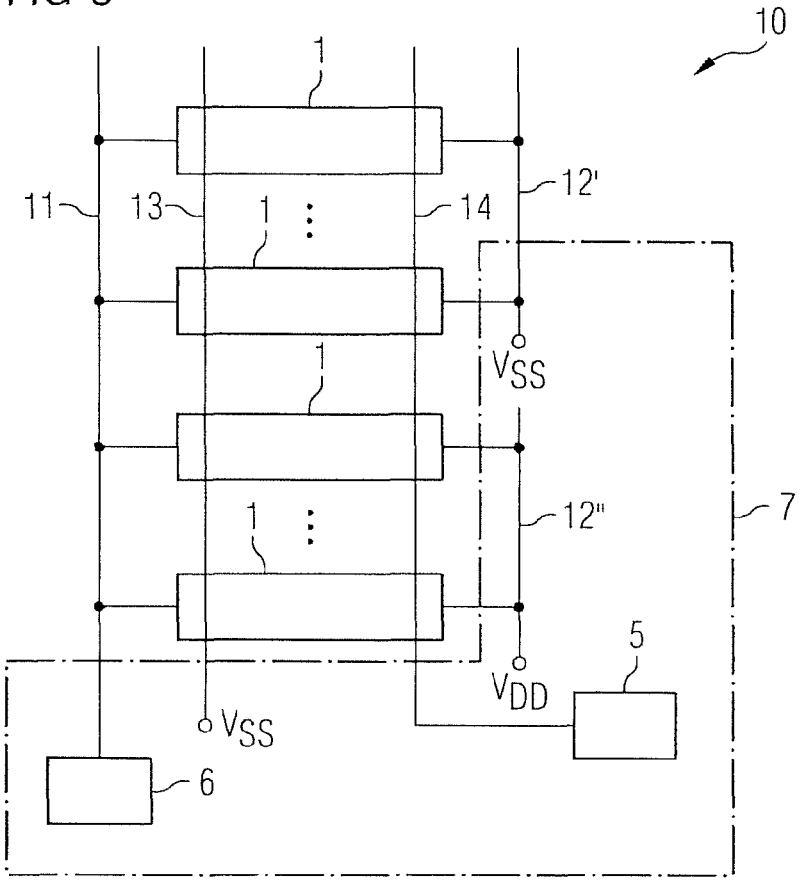
FIG. 5 illustrates yet another embodiment according to the invention, in which a first set of the memory cells is connected to a different dummy bit line than a second set of memory cells.

In comparison to the embodiment illustrated in FIG. 4a, in the embodiment in FIG. 5 the dummy bit line bar is divided into a first dummy bit line bar 12' and into a second dummy bit line bar 12" In this case, the first dummy bit line bar 12' is constantly connected to a LOW level (supply voltage $V_{SS}$) and the second dummy bit line bar 12" is constantly connected to a further potential (here: HIGH level or supply voltage $V_{DD}$). If the dummy word line 14 is triggered (that is to say has a HIGH level applied to it in pulsed fashion), a logic HIGH level is thus written to each of the plurality of the memory cells 1 connected to the first dummy bit line bar 12' and a different logic level (here: LOW level) is written to each of the plurality of memory cells 1 connected to the second dummy bit line bar 12".

Since, in present-day semiconductor memories in which e.g. 512 memory cells are connected to a same bit line, the case where all the memory cells connected to the same bit line apart from one memory cell have a logic 1 stored inside almost never occurs if only for statistical reasons (the probability is $½^{511}$), the case which is relevant in practice or the leakage current which is relevant in practice and which is brought about by the memory cells storing a logic HIGH level is presented by far better by the embodiment illustrated in FIG. 5.

With regard to the further construction and with regard to the further operation, the device 7 and thus the semiconductor memory 10 correspond to the embodiment illustrated in FIG. 4a.

Figure 6:
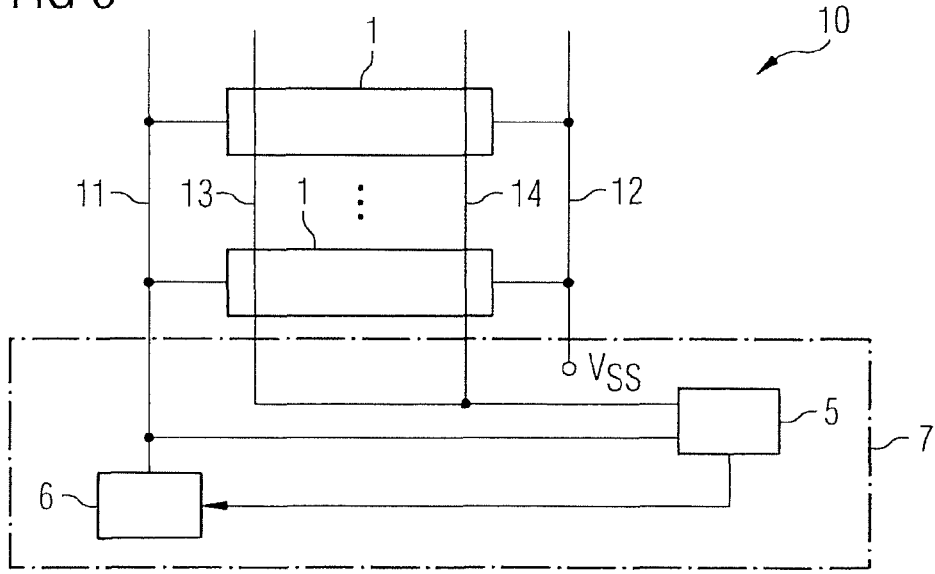
FIG. 6 illustrates another embodiment according to the invention of a device for controlling a memory access, in which two dummy word lines are triggered jointly via a driving unit.

In comparison with the embodiment illustrated in FIG. 4a, in the embodiment illustrated in FIG. 6, the first and the second dummy word line 13, 14 are connected to one another and are therefore triggered jointly by the driving unit 5. Therefore, in this embodiment, the driving unit 5 firstly has the task of providing a trigger pulse at predetermined points in time in order to write a logic HIGH level to the memory cell by means of the potentials, here $V_{DD}$ and $V_{SS}$, present at the same time on the dummy bit line 11 and the dummy bit line bar 12. Furthermore, in this operating phase, the detection device 6 is driven by the driving unit 5 in such a way that it does not influence the programming operation (that is to say the adjustment of a logic level in the memory cells).

It is also possible that, during the programming of the memory cells 1, the dummy bit line 11 is adjusted to the corresponding logic level (here $V_{DD}$) by means of the detection device 6. Consequently, the function of the detection device 6 of precharging the dummy bit line 11 would likewise be used for programming the memory cells 1. In the embodiment illustrated in FIG. 6, the detection device 6, for programming the memory cells 1, would be driven via the driving unit 5. This use of the detection device 6 for programming the memory cells 1 is possible in all the embodiments illustrated or discussed here.

In general, in all embodiments having a driving unit 5, it is possible for the detection device 6 to be driven via the driving unit 5. However, it is also possible in any embodiment, of course, for the control of the driving unit 5 and of the detection device 6 to be effected by a part of the device 7 that is not explicitly illustrated in the figures.

In the embodiment illustrated in FIG. 6, the driving unit 5 has the task of substantially inhibiting the switchable connection between the memory cells 1 and the dummy bit line 11 (the access transistor 2 on the left-hand side (in FIG. 2)), while the detection device 6, in a further operating phase, determines the completion of a memory access by means of the potential of the dummy bit line 11.

With regard to the further construction and with regard to the further operation, the device 7 and thus the semiconductor memory 10 correspond to the embodiment illustrated in FIG. 4a.

Figure 7:
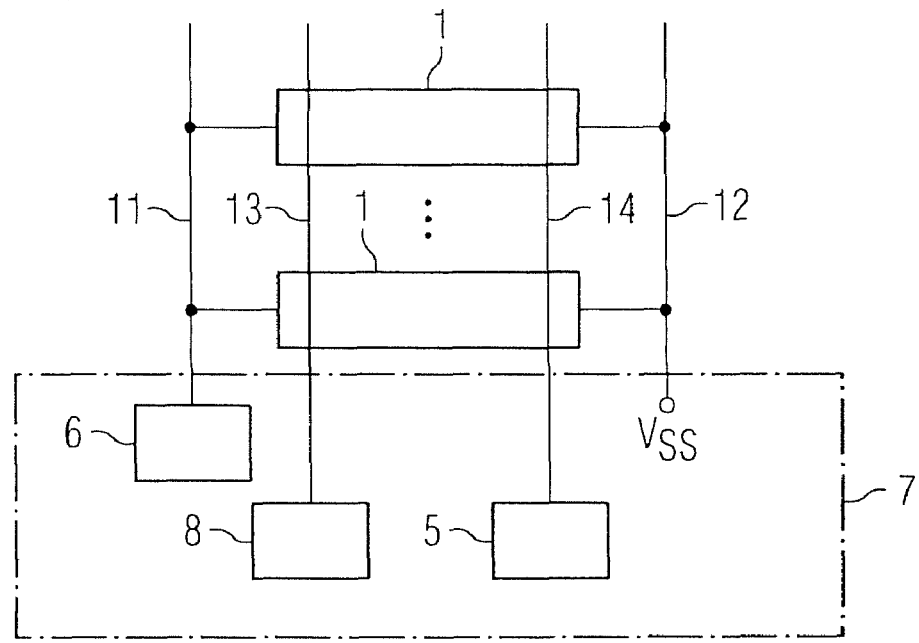
FIG. 7 illustrates a further embodiment according to the invention, in which one dummy word line is triggered by means of a driving unit and the potential of another dummy word line is predetermined via a facility.

In comparison with the embodiment illustrated in FIG. 4a, in the embodiment illustrated in FIG. 7 the potential of the first dummy word line 13 is adjusted by means of a facility 8 of the device 7. With regard to the further construction and with regard to the further operation, the device 7 and thus the semiconductor memory 10 correspond to the embodiment illustrated in FIG. 4a. In comparison with the embodiment illustrated in FIG. 5 or 6, the device 7 in FIG. 7 can trigger the second dummy word line 14 without the first dummy bit line 11 thereby also being connected to the memory cells 1 via the access transistor 2 (on the left in FIG. 2). The direct driving of the dummy word line 13 enables further parasitic effects to be reproduced. If, by way of example, some mechanisms have the effect of causing the disturbing leakage currents during a reading operation of the semiconductor memory 10 to be greater than the leakage currents simulated by the dummy memory cells 1, an increased potential can be adjusted for the potential of the first word line 13 by means of the facility 8 in order thereby to increase the leakage currents caused by each memory cell 1 via the access transistor on the left (see FIG. 2), in such a way that they correspond better to these disturbing leakage currents. The leakage currents can correspondingly be reduced if the potential on the first dummy word line 13 is reduced by comparison with the normal case (if appropriate also below 0 V).

Figure 8:
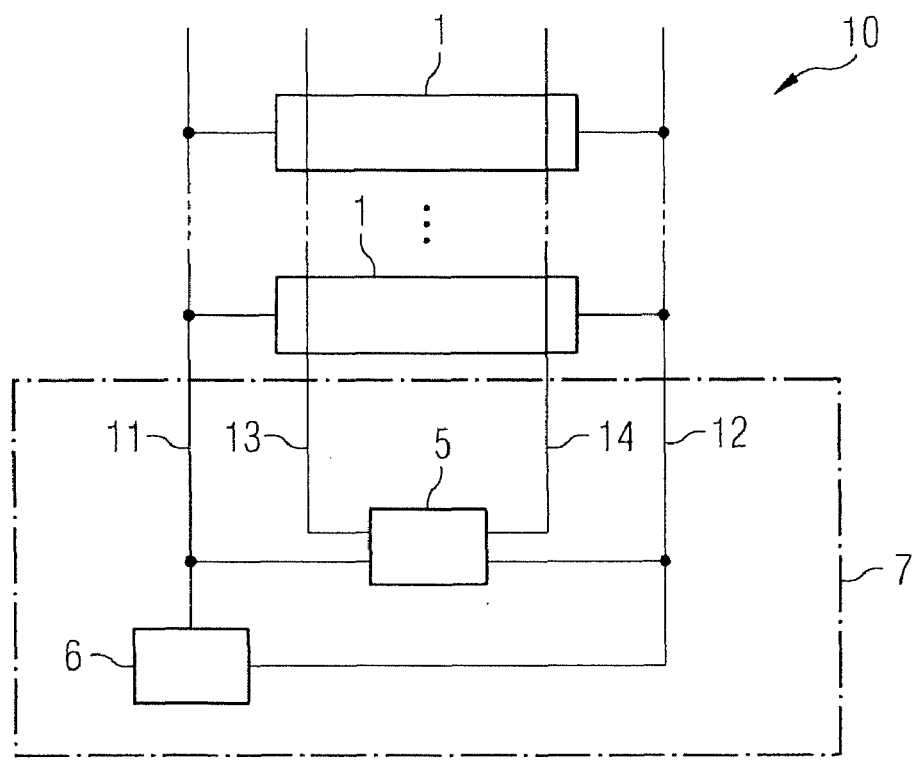
FIG. 8 illustrates yet another embodiment according to the invention.

The semiconductor memory 10 illustrated in FIG. 8 comprises (as also FIGS. 3-7) in addition to normal memory cells (not illustrated) a plurality of dummy memory cells 1 connected to the dummy bit line 11, the dummy bit line bar 12, the first dummy word line 13 and the second dummy word line 14. In addition to the driving unit 5 already illustrated in FIG. 2, the semiconductor memory 10 comprises a detection device 6, wherein the driving unit 5, the detection device 6 and the dummy bit line 11, the dummy bit line bar 12, the first dummy word line 13 and the second dummy word line 14 are part of a device 7 according to an embodiment of the invention of the semiconductor memory 10. In contrast to the embodiment in FIG. 2, the detection device 6 in this embodiment is connected to both dummy bit lines 11, 12, whereby the detection device 6 is also able to evaluate a potential difference between the potentials of the dummy bit line 11 and the dummy bit line bar 12 in order to determine the completion of a memory access depending on this.

A number P of the dummy memory cells 1 which are connected to the dummy bit line 11 and the dummy bit line bar 12 substantially corresponds to the number M of memory cells (not illustrated) which are connected to a normal bit line and to a normal bit line bar in the semiconductor memory 10. As the same cell layout for the functional memory cells is used for the dummy memory cells 1, the memory cells 1 on the dummy bit lines 11 and 12 have comparable loads with respect to the actual memory array. It should therefore always hold true that P is approximately equal to M. If it is taken into account that the detection device 6 likewise represents a load corresponding to a dummy memory cell 1, P=M−1 holds true for the ideal case. It goes without saying that embodiments in which this number of dummy memory cells 1 is somewhat greater or somewhat less than the number M of memory cells connected to the same bit line are also included within the scope of protection of this invention. Therefore, according to an embodiment of the invention P lies in particular in a range defined by the following equation (1)

$$0.9*M \leq P \leq 1.1*M. \qquad (1)$$

The arrangement constructed from dummy memory cells 1, dummy bit lines 11, 12 and dummy word lines 13, 14 in FIG. 2 to FIG. 8 differs significantly, with regard to the dummy word lines 13, 14 and the driving thereof, from a normal arrangement of memory cells for storing information items in the semiconductor memory 10. This is because while the word lines run perpendicular to the bit lines (that is to say horizontally in the figures illustrated) in a normal arrangement of memory cells, the dummy word lines 13, 14 in FIG. 2 to FIG. 8 run in parallel to the dummy bit lines 11, 12 (both vertical or column-wise).

The functioning of the device 7 illustrated in FIG. 8 is as follows.

Upon the occurrence of control signals such as Write-Enable, Read-Enable, Block-select etc., the device 7, for initialization purposes, writes either a logic LOW level or a logic HIGH level to all the dummy memory cells 1. This takes place in a manner analogous to that in the case of a memory cell, as has been described above with regard to FIG. 1. In order to write for example a logic LOW level to the dummy memory cell 1, the dummy bit line 11 is pulled to the potential $V_{SS}$ by the driving unit 5, and the first dummy word line 13 is pulled to the potential $V_{DD}$, in order to adjust the left-hand internal memory node 3 (see FIG. 2) to a logic LOW level, whereby a logic LOW level is written to all the dummy memory cells 1. If a logic HIGH level is to be written to all the dummy memory cells 1, the driving unit holds the dummy bit line bar 12 to the potential $V_{SS}$ and the second dummy word line 14 to the potential $V_{DD}$, whereby a logic LOW level is adjusted in the right-hand internal memory node 4 (see FIG. 2). On account of the above-described functioning of an SPSRAM memory cell 1, the left-hand internal memory node 3 is then adjusted to the logic HIGH level or $V_{DD}$ if the right-hand internal memory node 4 has the logic LOW level or the potential $V_{SS}$, since, in this case, the PMOS transistor at the top left (see FIG. 1) turns on and thus short-circuits the left-hand internal memory node 3 with $V_{DD}$ or pulls it to $V_{DD}$.

During a reading operation, both the dummy bit line 11 and the dummy bit line bar 12 are then precharged to $V_{DD}$ in a first step. The dummy bit line capacitances having a large magnitude store this potential for a certain period of time. In a further subsequent step—while the dummy bit lines are still precharged—the dummy bit line 11 is discharged to $V_{SS}$ via one or a plurality of transistors in the detection device 6. In this case, the detection device 6 measures the potential difference between the potential of the dummy bit line bar 12 and the dummy bit line 11. If this difference is greater than a predetermined threshold value, the sense amplifiers (not illustrated) of the semiconductor memory 10 are driven in order to evaluate the normal bit lines and bit lines bar connected to them, whereby the reading operation is concluded.

Since the individual dummy memory cell 1 does not differ from a normal memory cell with regard to its dimensioning, the individual dummy memory cell 1 has the same electrical behavior, in particular with regard to its leakage current, as a normal memory cell, such that the time behavior of a normal bit line can be optimally simulated by means of the dummy bit line 11 since the number of memory cells of the same type that are attached to the dummy bit line is (at least approximately) just the same as the number attached to the normal bit line.

Furthermore, it is possible to write either a logic LOW level or a logic HIGH level to actually all the dummy memory cells 1 as was explained by way of example above. Therefore, the device 7 for controlling a memory access as illustrated in FIG. 8 can control a reading operation wherein both the normal bit line and the normal bit line bar are precharged to $V_{DD}$, a logic HIGH level previously having been programmed into all the dummy memory cells 1 by the device 7. With the device 7, however, a control of complementary operation with a reading operation wherein both the normal bit line and the normal bit line bar are precharged to $V_{SS}$ is also possible without any problems by means of the device 7 in this case writing a logic LOW level to all the dummy memory cells 1. For complementary operation, an alternative construction (not illustrated) of the dummy memory cells is also recommended in such a way that the access transistors 2 are embodied as PMOS transistors.

Since the programming of the logic LOW levels or HIGH levels can be effected by explicit writing of complementary data via the two dummy bit lines 11 and 12, in the embodiment illustrated in FIG. 8 it is also not possible for a certain proportion of the dummy memory cells 1 not to have the desired logic value or level.

Figure 9:
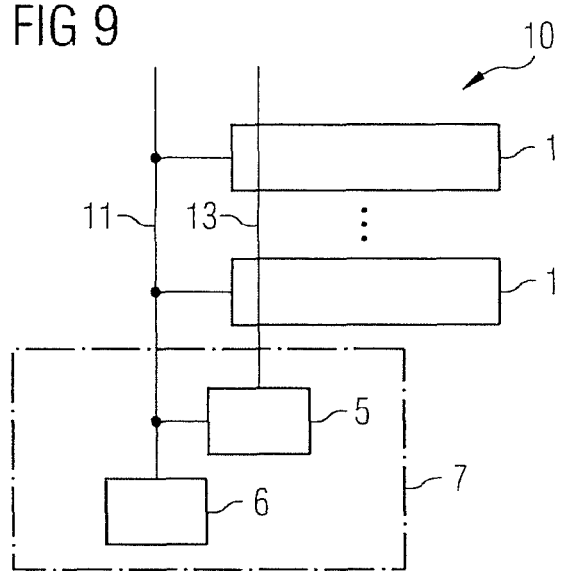
FIG. 9 illustrates an embodiment according to the invention in which the device according to the invention comprises only one dummy bit line and only one dummy word line.

In the embodiment illustrated in FIG. 9, the device 7 according to an embodiment of the invention comprises only one dummy bit line 11 and one dummy word line 13 in addition to the driving unit 5 and the detection device 6, wherein both the dummy bit line 11 and the dummy word line 13 are connected to all the dummy memory cells 1. A dummy memory cell 1 is understood here to mean a memory cell which is connected to at least one dummy bit line 11, 12 (only the dummy bit line 11 in the embodiment illustrated in FIG. 9), wherein a completion of a memory access of the semiconductor memory 1 is determined by means of the dummy memory cells 1 and the at least one dummy bit line 11. The dummy memory cells 1 can be memory cells having only one access transistor 2. However, it is also possible for the dummy memory cells 1 to be memory cells having two access transistors 2 (like e.g. the SPSRAM memory cell illustrated in FIG. 1), wherein only the dummy bit line 11 and the first dummy word line 13 are driven or can be accessed in the embodiment illustrated in FIG. 9. In other words, the dummy memory cell 1 illustrated in FIG. 9 operates in "single rail" fashion both during writing and during reading.

The functioning of the device 7 illustrated in FIG. 9 is as follows.

At certain points in time, the device 7 writes either a logic LOW level or a logic HIGH level to all the dummy memory cells 1. For this purpose, the corresponding logic level is adjusted by means of the dummy bit line 11 via the driving unit 5 and the dummy word line 13 is triggered via the driving unit 5 in order thus to write the logic level of the dummy bit line 11 to the dummy memory cells 1. For this purpose, the potential of the dummy word line 11 can also be adjusted to a level above $V_{DD}$ (e.g. to $V_{DD}+V_{th}$) in order to facilitate the programming of a logic HIGH level into the dummy memory cells 1.

During a reading operation, in a first step, the dummy bit line 11 is precharged either to $V_{DD}$ or to $V_{SS}$, depending on which reading concept is used. In a further step, the dummy bit line 11 is pulled by means of the detection device 6 to the complementary potential, depending on which reading concept is used, that is to say either to $V_{SS}$ or to $V_{DD}$, the reading of a logic LOW level or of a logic HIGH level (depending on the reading concept) from a normal memory cell being simulated. In this case, the detection device monitors the potential on the dummy bit line 11. If the potential falls below a first threshold value or rises above a second threshold value (depending on the reading concept), the sense amplifiers (not illustrated) of the semiconductor memory 10 are driven in order to evaluate the normal bit lines (and possibly bit lines bar) connected to them, whereby the reading operation is concluded.

How the constant first or second threshold value is adjusted depends on the requirements made of the semiconductor memory 10. In the case of a time-critical semiconductor memory, the first threshold value is chosen in a range of 20% to 50% (better 30% to 40%) of the magnitude of the difference between the first potential and the second potential below the first potential, if the first potential lies above the second potential. If the first potential lies below the second potential, the second threshold value then lies in a range of 20% to 50% (better 30% to 40%) of the magnitude of the difference between the first potential and the second potential above the first potential.

By contrast, if the semiconductor memory 10 is not a time-critical semiconductor memory, the first or second threshold value can be chosen in a range of 50% to even 80% (better 60% to 70%) below or above the first potential.

In other words, in the case of a time-critical semiconductor memory, a potential change of 20% to 50% (better 30% to 40%) of the magnitude of the difference between the first potential and the second potential on the basis of the potential to which the dummy bit line 11 was precharged suffices for driving the sense amplifiers of the semiconductor memory 10, while this potential change in the case of time-noncritical semiconductor memories can be 50% to even 80% (better 60% to 70%) until the sense amplifiers of the semiconductor memory 10 are driven.

It should be pointed out that in the case of time-critical semiconductor memories, the detectors which detect an over-/undershooting of the respective threshold value are also quality detectors which operate more precisely and usually have a higher current consumption than those detectors which are used in time-noncritical semiconductor memories.

It is known to the person skilled in the art that many features which were explained explicitly for one of the embodiments illustrated in FIG. 2 to 9 can also be used in others of the embodiments illustrated in FIG. 2 to 9 even though they were not mentioned explicitly in the corresponding embodiment.

By way of example, dividing the dummy bit line into the first dummy bit line bar 12' and the second dummy bit line bar 12" can be used in all embodiments which have a dummy bit line bar 12. In those embodiments in which the dummy bit line bar 12 is adjusted by means of the driving unit 5, the first dummy bit line bar 12' and the second dummy bit line bar 12" would then also be adjusted by the driving unit 5.

It should be taken into consideration, of course, that dividing the dummy bit line bar into a dummy bit line bar' and a dummy bit line bar" is expedient only when the two word lines 13 and 14 are not connected to one another or do not always have the same potential, since the first dummy word line 13 is essentially permitted to be switched off or adjusted only in slightly conducting fashion, in order to avoid a short circuit via the dummy bit line 11.

Furthermore, in the embodiments illustrated, instead of the preferred logic HIGH level, depending on which reading concept is used, the logic LOW level can also be written to the dummy memory cells 1. For this purpose, for example in the embodiments illustrated in FIGS. 3, 4, 6 and 7, the dummy bit line bar 12 would in each case have $V_{DD}$ applied to it instead of $V_{SS}$. Supplementarily, it is then also possible to use an alternative construction (not illustrated) of the dummy memory cells 1 wherein the access transistors 2 are embodied as PMOS transistors.

If both the dummy bit line 11 and the dummy bit line bar 12 can be adjusted by the driving unit 5 and, in addition, the two access transistors 2 can be activated by means of the first and the second dummy word line 13, 14, as is the case in the embodiments illustrated in FIGS. 2 and 8, the logic level can be written to the dummy memory cells 1 either by means of the dummy bit line 11 and the first dummy word line 13 or by means of the dummy bit line bar 12 and the second dummy word line 14 or simultaneously by means of both the dummy bit line 11 and the dummy bit line bar 12 and the first and the second dummy word line 13, 14.

The feature of writing a logic HIGH level directly to the dummy memory cells 2 by adjusting a dummy word line 13 or 14 to a potential above $V_{DD}$ (at least $V_{DD}+V_{th}$) is possible, in principle, in all the illustrated embodiments in which a dummy bit line 13 or 14 (in particular also in the embodiment in FIG. 5 for the potential of the second dummy word line 14) has hitherto been adjusted to a potential $V_{DD}$.

Figure 10:
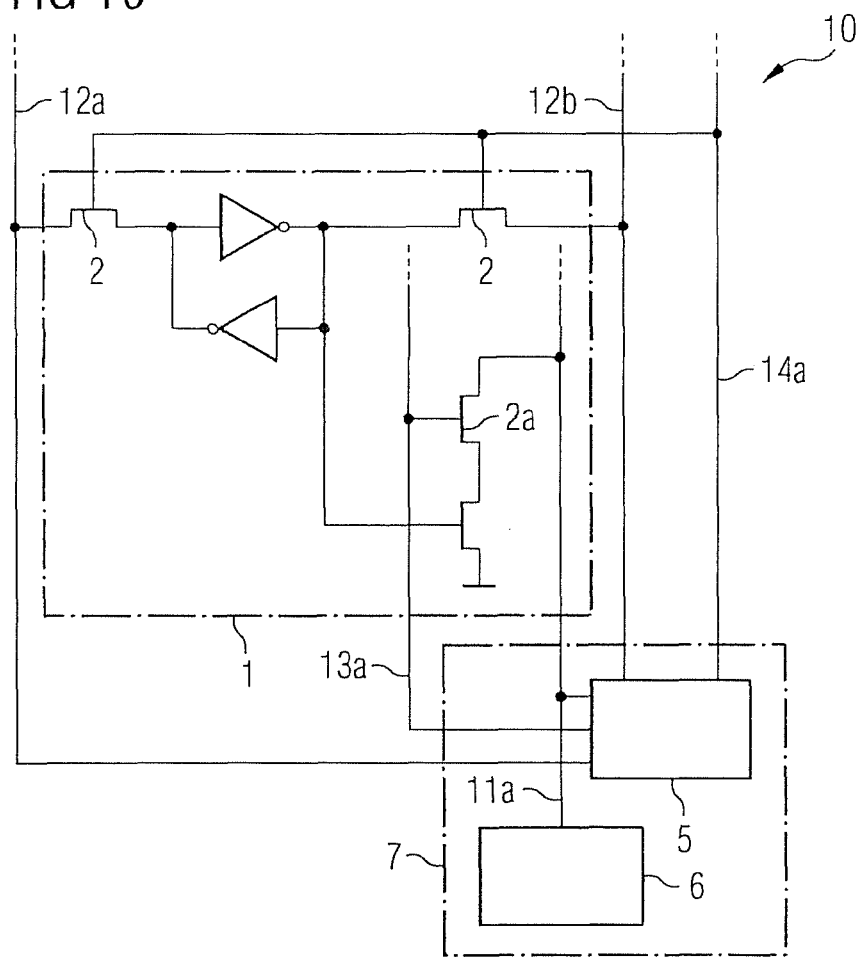
FIG. 10 illustrates an embodiment according to the invention in which the dummy memory cells comprise SPSRAM memory cells having a separate pull-down read bit line.

FIG. 10 illustrates an 8T SPSRAM memory cell 1 having a pull-down reading bit line 11a as one of the dummy memory cells 1. This dummy memory cell 1 is constructed like a 6T SPSRAM memory cell in FIG. 1 apart from the two transistors centrally on the right in FIG. 10. In contrast to the 6T SPSRAM memory cell, however, the dummy memory cell 1 in FIG. 10 has a connection for a separate reading bit line or dummy reading bit line 11a, which is connected to the dummy memory cell 1 by means of the access transistor 2a. This dummy reading bit line 11a, too, is in turn to be precharged suitably prior to read-out; to the logic HIGH level in the embodiment illustrated in FIG. 10. If a first dummy word line 13a is then activated during the reading operation, the logic level stored in the dummy memory cell 1 is transferred inversely onto the dummy reading bit line 11a. The two dummy writing bit lines 12a and 12b are only used for writing to the dummy memory cell 1, for which reason the access transistors 2 connected to the two dummy writing bit lines 12a and 12b are also always driven by only one (the same) dummy word line 14a. It should be pointed out that the dummy memory cell 1 illustrated in FIG. 10 could also be read via the dummy bit lines 12a, 12b by means of the dummy word line 14a in the manner described above. For this purpose, however, one of the dummy bit lines 12a, 12b would have to be connected to the detection device 6. During normal operation, a memory cell of the type 8T SPSRAM memory cell 1 having a pull-down reading bit line operates in differential (e.g. "dual rail") fashion during writing and in "single rail" fashion during reading.

In contrast to the embodiments discussed above, the embodiment illustrated in FIG. 10 has three dummy bit lines 11a, 12a, 12b, wherein two dummy bit lines 12a, 12b are designed for writing to the dummy memory cell 1 and one dummy bit line 11a is designed for reading from the dummy memory cell 1. Accordingly, all embodiments according to the invention or features of embodiments according to the invention which operate with two bit lines 11, 12 can also be realized correspondingly with the embodiment illustrated in FIG. 10.

In the dummy memory cell 1 illustrated in FIG. 10, the two dummy writing bit lines 12a, 12b can have constant complementary potentials (e.g. $V_{DD}$ and $V_{SS}$) in order, upon an activation of the dummy word line 14a, to write a logic HIGH level to the dummy memory cell 1, instead of only the dummy bit line bar 12 having a constant potential, as is the case of the embodiments of FIG. 3 to 6. Furthermore, in the dummy memory cell 1 illustrated in FIG. 10, it is possible to divide both the dummy writing bit line 12a and the dummy writing bit line bar 12b, such that a first dummy writing bit line 12a' and a first dummy writing bit line bar 12b' are connected to a first set of the dummy memory cells 1 and a second dummy memory writing bit line 12a" and a second dummy writing bit line bar 12b" are connected to a second set of the dummy memory cells 1, instead of the dummy bit line 12 being divided, as is the case in the embodiment in FIG. 5. The reference symbols 12a', 12a", 12b', 12b" are not illustrated in the drawing; they are only intended to serve for a corresponding reference to FIG. 5 and the reference symbols 12' and 12" there.

Figure 11:
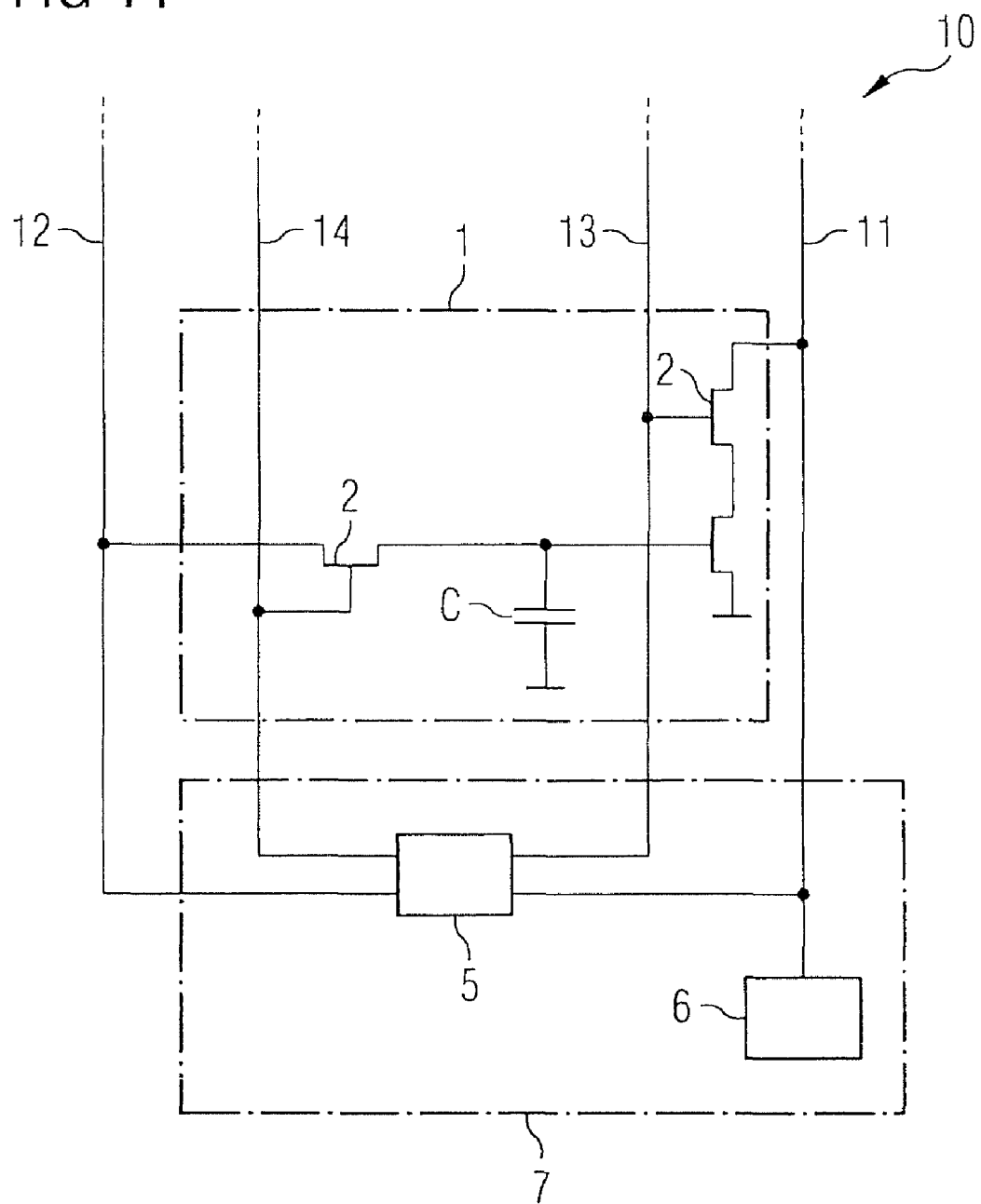
FIG. 11 illustrates an embodiment according to the invention in which the dummy memory cells comprise 3T memory cells.

FIG. 11 illustrates a 3T memory cell 1 as one of the dummy memory cells 1. To this dummy memory cell 1, a logic level is written to the dummy memory cell 1 via the second dummy bit line 12 and the second dummy word line 14. The inversion of this logic level can then be output onto the first dummy bit line 11 by means of the first dummy word line 13. In other words, although the dummy memory cell 1 illustrated in FIG. 11 is connected to a first and a second dummy bit line 11, 12 and a first and a second dummy word line 13, 14, the dummy memory cell 1 is read via the first dummy bit line 11 and the first dummy word line 13 and is written to via the second dummy bit line 12 and the second dummy word line 14. Therefore, the first dummy bit line 11 is also connected to the detection device 6. Accordingly, the 3T memory cell operates in the "single rail" mode both during writing and during reading, the dummy bit lines 11, 12 in the 3T memory cell being different for writing and reading, in contrast to the embodiment illustrated in FIG. 9.

As in the embodiment illustrated in FIG. 5, it is also possible in a semiconductor memory 10 which operates with 3T memory cells for the second dummy bit line 12 to be divided into a first and a second dummy bit line 12', 12", wherein the first dummy bit line 12' is connected to a first set of the dummy memory cells 1 and the second dummy bit line 12" is connected to a second set of the dummy memory cells 1.

As in the embodiments illustrated in FIGS. 3, 4, 6 and 7, it is also possible in the embodiment illustrated in FIG. 11 for the second dummy bit line 12 to constantly have a potential (e.g. $V_{SS}$) which is written to the dummy memory cell 1 when the second dummy word line 14 is activated.

LIST OF REFERENCE SYMBOLS

1 Memory cell
2 Access transistor
3,4 Internal memory node
5 Driving unit
6 Detection device
7 Device
10 Semiconductor memory
11,12 Bit line
13,14 Word line

What is claimed is:

1. A method for controlling a memory access of a memory wherein the memory comprises memory cells,
   wherein the memory access is a reading operation or a writing operation of the memory,
   wherein at least one dummy bit line is connected to a plurality of memory cells of said memory cells such that a content of said plurality of memory cells is readable via the at least one dummy bit line, and
   wherein each of said plurality of memory cells is connected to the at least one dummy bit line and to at least one dummy word line such that each of said plurality of memory cells is settable to a predetermined potential by means of the at least one dummy bit line and by means of the at least one dummy word line, said method comprising:
   determining a completion of the memory access by means of at least one dummy bit line; and
   altering the predetermined potential of one or more of said plurality of memory cells.

2. The method as claimed in claim 1, wherein said memory cells are substantially identical.

3. The method as claimed in claim 1, wherein the method further comprises:
   inhibiting switchable connections between said plurality of memory cells and the at least one dummy bit line, in a time interval in which the detection device determines the completion of the memory access on the basis of a potential profile of the at least one dummy bit line by setting at least one of the at least one dummy word line to a predetermined potential, and determining the predetermined potential such that a leakage current between said plurality of memory cells and the at least one dummy bit line is thus adjusted to a predetermined leakage current.

4. A device for controlling a memory access of a memory, wherein the memory comprises memory cells, wherein the memory access is a reading operation or a writing operation of the memory, the device comprising:

at least one dummy bit line comprising:
a first dummy bit line and a second dummy bit line,
wherein each of said plurality of memory cells comprises a first access transistor and a second access transistor,
wherein a first connection of each first access transistor is connected to a first internal node of the respective memory cell of said plurality of memory cells and a first connection of each second access transistor is connected to a second internal node of the respective memory cell of said plurality of memory cells,
wherein the device is configured such that the first dummy bit line is connected to a second connection of each first access transistor and that each control input of each first access transistors and each control input of each second access transistors is connected to the at least one dummy word line and that the second dummy bit line is connected to a second connection of each second access transistor;

at least one dummy word line comprising:
a first dummy word line and a second dummy word line, and
wherein the device is configured such, that the control input of each first access transistor is connected to the first dummy word line, and that the control input of each second access transistor is connected to the second 5 dummy word line; and a detection device, wherein the detection device is configured to determine a completion of the memory access by means of the at least one dummy bit line, wherein the device is configured such that each of a plurality of memory cells of said memory cells is connected to the at least one dummy bit line and to the at least one dummy word line, wherein the device is configured such that the at least one dummy bit line is connected to said plurality of memory cells such that a content of said plurality of memory cells is readable via the at least one dummy bit line, wherein said plurality of memory cells is connected such that each of said plurality of memory cells is settable to a predetermined potential by the device, wherein the device is configured to continuously hold the second dummy word line at a first predetermined potential, such that a value of the second dummy bit line is continuously written to each of said plurality of memory cells, wherein the device is configured to continuously hold the second dummy bit line at a second predetermined potential, wherein the device is configured to continuously hold the first dummy word line at a third predetermined potential, such that the first access transistors of said plurality of memory cells are thereby substantially inhibited, and wherein the detection device is configured to determine the completion of the memory access by means of the first dummy bit line.

5. A device for controlling a memory access of a memory, wherein the memory comprises memory cells, wherein the memory access is a reading operation or a writing operation of the memory, the device comprising:

at least one dummy bit line comprising:
a first dummy bit line and a second dummy bit line,
wherein each of said plurality of memory cells comprises a first access transistor and a second access transistor,
wherein a first connection of each first access transistor is connected to a first internal node of the respective memory cell of said plurality of memory cells and a first connection of each second access transistor is connected to a second internal node of the respective memory cell of said plurality of memory cells,
wherein the device is configured such that the first dummy bit line is connected to a second connection of each first access transistor and that each control input of each first access transistors and each control input of each second access transistors is connected to the at least one dummy word line and that the second dummy bit line is connected to a second connection of each second access transistor;

at least one dummy word line comprising:
a first dummy word line and a second dummy word line, and
wherein the device is configured such, that the control input of each first access transistor is connected to the first dummy word line, and that the control input of each second access transistor is connected to the second 5 dummy word line; and a detection device, wherein the detection device is configured to determine a completion of the memory access by means of the at least one dummy bit line, wherein the device is configured such that each of a plurality of memory cells of said memory cells is connected to the at least one dummy bit line and to the at least one dummy word line, wherein the device is configured such that the at least one dummy bit line is connected to said plurality of memory cells such that a content of said plurality of memory cells is readable via the at least one dummy bit line, wherein said plurality of memory cells is connected such that each of said plurality of memory cells is settable to a predetermined potential by the device, wherein the device comprises a driving unit configured to witch the second dummy word line to a first predetermined potential at least once, such that a value of the second dummy bit line is written to each of said plurality of memory cells, wherein the device is configured to continuously hold the second dummy bit line at a second predetermined potential, wherein the device is configured to continuously hold the first dummy word line at a third predetermined potential, such that the first access transistors of said plurality of memory cells are thereby substantially inhibited, and wherein the detection device determines the completion of the memory access by means of the first dummy bit line.

6. A device for controlling a memory access of a memory, wherein the memory comprises memory cells, wherein the memory access is a reading operation or a writing operation of the memory, the device comprising:

at least one dummy bit line comprising:
a first dummy bit line and a second dummy bit line, wherein each of said plurality of memory cells comprises a first access transistor and a second access transistor, wherein a first connection of each first access transistor is connected to a first internal node of the respective memory cell of said plurality of memory cells and a first connection of each second access transistor is connected to a second internal node of the respective memory cell of said plurality of memory cells, wherein the device is configured such that the first dummy bit line is connected to a second connection of each first access transistor and that each control input of each first access transistors and each control input of each second access transistors is connected to the at least one dummy word line and that the second dummy bit line is connected to a second connection of each second access transistor;

at least one dummy word line comprising:

a first dummy word line and a second dummy word line, and wherein the device is configured such, that the control input of each first access transistor is connected to the first dummy word line, and that the control input of each second access transistor is connected to the second 5 dummy word line; and a detection device, wherein the detection device is configured to determine a completion of the memory access by means of the at least one dummy bit line, wherein the device is configured such that each of a plurality of memory cells of said memory cells is connected to the at least one dummy bit line and to the at least one dummy word line, wherein the device is configured such that the at least one dummy bit line is connected to said plurality of memory cells such that a content of said plurality of memory cells is readable via the at least one dummy bit line, wherein said plurality of memory cells is connected such that each of said plurality of memory cells is settable to a predetermined potential by the device, wherein the device comprises a driving unit, which is configured to switch the first dummy word line and the second dummy word line to a first predetermined potential at least once, such that a value of the second dummy bit line is written to each of said plurality of memory cells, wherein the device is configured to continuously hold the second dummy bit line at a second predetermined potential, wherein the driving unit is configured to hold afterwards the first dummy word line and the second dummy word line, for determining the completion of the memory access, at a third predetermined potential, such that the first access transistors of said plurality of memory cells are thereby substantially inhibited, and wherein the detection device is configured to determine the completion of the memory access by means of the first dummy bit line.

* * * * *